(12) United States Patent
Lin et al.

(10) Patent No.: US 6,734,055 B1
(45) Date of Patent: May 11, 2004

(54) MULTI-LEVEL (4 STATE/2-BIT) STACKED GATE FLASH MEMORY CELL

(75) Inventors: Chrong Jung Lin, Hsin-Tian (TW); Shui-Hung Chen, Hsin-Chu (TW); Hsin-Ming Chen, Hsin-Ying (TW)

(73) Assignee: Taiwan Semiconductor Manufactoring Company, Hsin-Chu (TW)

( * ) Notice: Subject to any disclaimer, the term of this patent is extended or adjusted under 35 U.S.C. 154(b) by 0 days.

(21) Appl. No.: 10/295,157

(22) Filed: Nov. 15, 2002

(51) Int. Cl.$^7$ .......................................... H01L 21/8238
(52) U.S. Cl. ..................... 438/201; 438/211; 438/258; 438/261; 438/266
(58) Field of Search ................. 438/201, 211, 438/238, 257, 258, 259, 261, 262, 266

(56) References Cited

U.S. PATENT DOCUMENTS

| | | | |
|---|---|---|---|
| 5,666,307 A | 9/1997 | Chang | 365/185.03 |
| 5,714,412 A | 2/1998 | Liang et al. | 438/266 |
| 5,851,881 A | 12/1998 | Lin et al. | 438/261 |
| 5,877,523 A | 3/1999 | Liang et al. | 257/315 |
| 6,225,162 B1 * | 5/2001 | Lin et al. | 438/261 |
| 6,326,662 B1 * | 12/2001 | Hsieh et al. | 257/316 |
| 6,391,717 B1 * | 5/2002 | Shin et al. | 438/257 |
| 6,468,863 B2 * | 10/2002 | Hsieh et al. | 438/261 |
| 6,506,646 B1 * | 1/2003 | Miyagi | 438/257 |

* cited by examiner

Primary Examiner—Kevin M. Picardat
(74) Attorney, Agent, or Firm—George O. Saile; Stephen B. Ackerman; Douglas R. Schnabel

(57) ABSTRACT

A method is provided for forming a highly dense stacked gate flash memory cell with a structure having multi floating gates that can assume 4 states and, therefore, store 2 bits at the same time. This is accomplished by providing a semiconductor substrate having gate oxide formed thereon, and shallow trench isolation and a p-well formed therein. A layer of nitride is next formed over the substrate and an opening formed therein. Polysilicon floating gate spacers are formed in the opening. A dielectric layer is then formed over the floating gates followed by the forming of a control gate. The adjacent nitride layer is then removed leaving a multi-level structure comprising a control gate therebetween multi floating gates with the intervening dielectric layer.

18 Claims, 7 Drawing Sheets

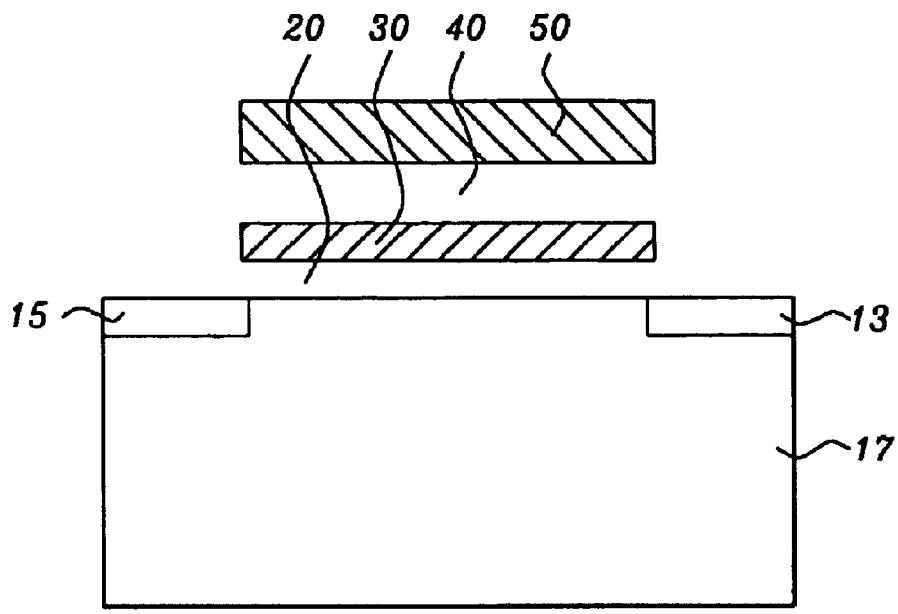
*FIG. 1a — Prior Art*
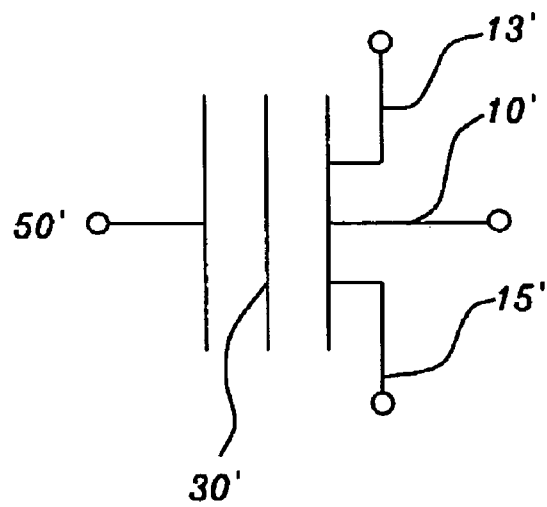
*FIG. 1b — Prior Art*

US 6,734,055 B1

MULTI-LEVEL (4 STATE/2-BIT) STACKED GATE FLASH MEMORY CELL

BACKGROUND OF THE INVENTION (1) Field of the Invention

The present invention relates to the manufacture of semiconductor memories, and in particular, directed to a multi-level stacked gate flash memory cell of 4 state/2-bit storage capability and to a method of forming the same.

(2) Description of the Related Art

The present state of the art for increasing memory density in semiconductors is to reduce the size of the memory cell. Another approach to improving memory density is to increase the number of possible states in a cell. The multi-level concept is applicable to both volatile and nonvolatile memories, but has been difficult to implement at a commercial level. It is disclosed later in the embodiments of this invention a method of forming a highly dense stacked gate flash memory cell with a structure having multi floating gates that can assume 4 states and, therefore, store 2 bits at the same time.

The disclosed multi-bit storage takes advantage of the analog nature of the flash storage element. The conventional 1 bit/cell approach would place the cell in one of two states, a "0" or "1", using a program or erase operation. Erase might be denoted as the absence of charge and program as the presence of charge on the floating gate. Thus, the cell is placed in one of two discrete charge bands. If programming can be done accurately enough, the cell can be placed in one of four discrete charge bands, or, states, achieving 2 bits/cell storage. A novel state assignment for the disclosed cell will be shown later in the embodiments of this invention.

Memory devices include the earlier electrically erasable and electrically programmable read-only memories (EEPROMs), and now, the flash electrically erasable and electrically programmable read-only memories (flash EEPROMs). Generally, flash EEPROM cells having both functions of electrical programming and erasing may be classified into two categories, namely, a stacked-gate structure and a floating gate structure, which is not discussed here. A conventional stacked-gate type cell is shown in FIG. 1a where, as is well known, tunnel oxide film (20), a floating gate (30), an interpoly insulating film (40) and a control gate (50) are sequentially stacked on a silicon substrate (10) between a drain region (13) and a source region (15) separated by channel region (17). Substrate (10) and channel region (17) are of a first conductivity type, and the first (13) and second (15) doped regions are of a second conductivity type that is opposite the first conductivity type. FIG. 1b shows an electrical schematic of the stacked gate cell of FIG. 1a with correspondingly primed numerals.

The programming and erasing of the flash EEPROM shown in FIG. 1a is accomplished electrically and in-circuit by using Fowler-Nordheim (F-N) tunneling. Basically, a sufficiently high voltage is applied to control gate (50) and drain (13) while source (15) is grounded to create a flow of electrons in channel region (17) in substrate (10). Some of these electrons gain enough energy to transfer from the substrate to control gate (50) through thin gate oxide layer (20) by means of (F-N) tunneling. The tunneling is achieved by raising the voltage level on control gate (50) to a sufficiently high value of about 12 volts. As the electronic charge builds up on floating gate (30), the electric field is reduced, which reduces the electron flow. When, finally, the high voltage is removed, floating gate (30) remains charged to a value larger than the threshold voltage of a logic high that would turn it on. Thus, even when a logic high is applied to the control gate, the EEPROM remains off. Since tunneling process is reversible, floating gate (30) can be erased by grounding control gate (50) and raising the drain voltage, thereby causing the stored charge on the floating gate to flow back to the substrate.

The programming of the stacked-gate cell shown in FIG. 1a is performed on a single floating gate (30). It will be appreciated by those skilled in the art that the multi-floating gate disclosed in the present invention will provide multi-bit storage based on twice the two-states possible on each floating gate in a stacked-gate cell. In prior art, workers in the field have disclosed multi-level memory cells, but for split-gate memory cells only.

Thus, Liang, et al., disclose in U.S. Pat. No. 5,714,412 a multi-level flash memory cell as applied to a split-gate, but not to a stacked-gate flash memory cell. In their disclosure, a semiconductor memory device is formed on a doped semiconductor substrate, and covered with a tunnel oxide layer covered in turn with a doped first polysilicon layer. The first polysilicon layer is patterned into a pair of floating gate electrodes. An interelectrode dielectric layer covers the floating gate electrodes, the sidewalls of the floating gate electrodes and the edges of the tunnel oxide below the floating gate electrodes. A second polysilicon layer overlies the interelectrode dielectric layer and is in turn covered by a tungsten silicide layer. A second dielectric layer covers the tungsten silicide layer. A control gate electrode which spans the pair of floating gate electrodes is formed by the second polysilicon layer, the tungsten silicide and the first and second dielectric layers patterned into a gate electrode stack providing a control gate electrode spanning across the pair of floating gate electrodes. There are source/drain regions in the substrate self-aligned with the control gate electrode. U.S. Pat. No. 5,877,523 by the same inventors discloses the structure of the same multi-level, split-gate, flash memory cell.

A different PMOS flash memory cell capable of multi-level threshold voltage storage is disclosed in U.S. Pat. No. 5,666,307 by Chang. A P-channel flash EEPROM cell has P+ source and P+ drain regions, and a channel extending therebetween, formed in an N-type well. A thin layer of tunnel oxide is provided over the channel A poly-silicon floating gate and poly-silicon control gate, separated by a dielectric layer, overlie the tunnel oxide. Programming is accomplished via hot electron injection while erasing is realized by electron tunneling. The threshold voltage of the cell is controlled by the magnitude of voltage coupled to the floating gate during programming. PMOS devices conduct a gate current via hot electron injection over a narrow range of gate voltages, thereby allowing for precise control over the gate current and thus over the charging of the floating gate. This control over the gate current allows the threshold voltage of the cell to be more accurately controlled, thereby resulting in a more reliable cell capable of storing a greater number of bits of data.

Another invention by Lin, et al., in U.S. Pat. No. 5,851,881 provides a structure and a method of manufacturing split-gate MONOS multi-level logic memory device. The memory device has a poly stacked gate transistor in series with a MONOS (Metal-Oxide Nitride-Oxide Semiconductor) transistor. A tunnel oxide is first formed on the surface of a semiconductor substrate. The substrate has a stacked gate channel area and a MONOS channel area in the active regions. A poly floating gate electrode is formed over the stacked gate channel region. An ONO layer having a memory nitride layer is formed over the floating gate and the tunnel oxide layer over the MONOS channel region. A control gate electrode is formed over the ONO layer spanning across the poly floating gate electrode and the MONOS channel region. Source/drain regions are formed in the substrate. A poly flash transistor and a MONOS flash transistor combine to form the 4-level logic memory cell of the invention.

The multi-level logic memory cell disclosed in the instant invention is formed of multi-floating gates providing multi-bit storage based on twice the two-states possible on each floating gate in a stacked-gate cell.

SUMMARY OF THE INVENTION

It is therefore an object of this invention to provide a method of forming a multi-level stacked gate flash memory cell.

It is another object of this invention to provide a method of forming a highly dense stacked gate flash memory cell with a structure having multi floating gates that can assume 4 states and, therefore, store 2 bits at a time.

It is still another object of this invention to provide a stacked-gate flash memory cell structure having multi floating gates.

These objects are accomplished by providing a substrate having gate oxide formed thereon and shallow trench and P-well formed therein; forming nitride layer over said substrate; patterning a self-aligned gate to form an opening in said nitride layer; forming a first oxide layer over said substrate including said opening; forming first oxide spacers in said opening; performing floating source implant in said substrate through said opening; removing said first oxide spacers in said opening; forming a first polysilicon layer over said substrate including said opening in said nitride layer; forming first polysilicon floating-gate spacers on the vertical walls of said opening in said nitride layer; forming a conformal dielectric layer over said substrate including said first polysilicon floating-gate spacers and the bottom of said opening; forming second polysilicon layer over said substrate including said opening; removing said second polysilicon layer until said conformal dielectric layer over said opening is reached, thus leaving said second polysilicon in said opening as a control gate therebetween said floating-gate spacers with intervening said conformal dielectric layer; removing said conformal dielectric layer adjacent said opening and said nitride layer underlying said dielectric layer; performing mildly doped drain implant to form the drain of said stacked gate cell; forming a second dielectric layer over said substrate including said opening; and forming second dielectric spacers on the outside vertical walls of said floating gate spacers to complete the forming of said multi-level stacked gate flash memory cell.

These objects are further accomplished by providing a multi-level, multi-bit stacked gate flash memory cell structure comprising: floating gate spacers having convex walls facing each other, and vertical outside walls; a conformal dielectric layer covering said convex walls of said floating gate spacers; a control gate therebetween said convex walls of said floating gate spacers with intervening said conformal dielectric layer; and oxide spacers formed on said vertical outside walls of said floating gates.

BRIEF DESCRIPTION OF THE DRAWINGS

FIG. 1a is a cross-sectional view of a conventional stacked-gate type memory cell of prior art.

FIG. 1b shows an electrical schematic of the stacked gate cell of FIG. 1a.

DESCRIPTION OF THE PREFERRED EMBODIMENTS

Figure 2A:
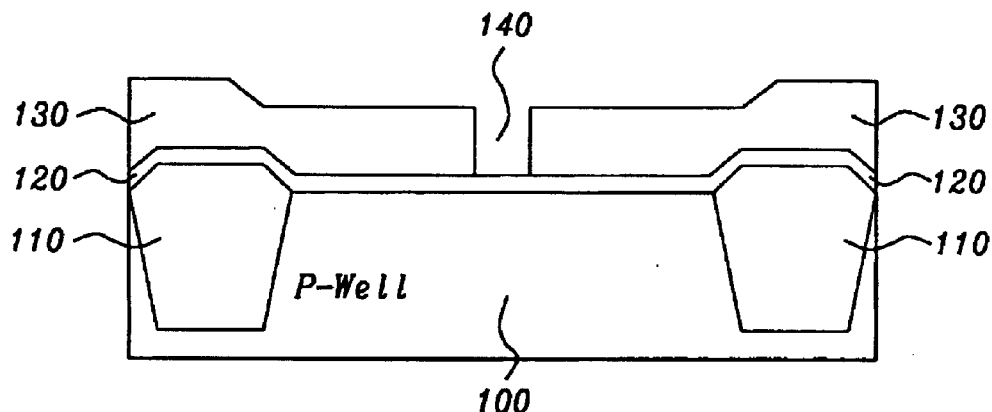
FIG. 2a is a cross-sectional view of a semiconductor substrate having P-well and shallow trench isolation formed therein, and gate oxide formed thereon after having been patterned with self-aligned gate in a silicon nitride layer, according to the present invention.

Referring now to the drawings, specifically to FIGS. FIGS. 2a–2l, and FIGS. 3a–3f, there is shown a preferred method of forming a stacked gate flash memory cell with a structure having two floating gates that can assume 4 states and, therefore, store 2 bits at the same time.

In FIG. 2a, a substrate (100) is shown provided with a P-well, shallow trench isolation (110) therein and gate oxide (120) formed thereon, following conventional methods. Nitride layer (130) is formed over the substrate and patterned to have a self-aligned gate opening (140) as shown in the same Figure. It is preferred that forming of nitride layer is accomplished by chemical vapor deposition (CVD) at a temperature between about 300 to 700° C. by reacting dichlorosilane ($SiCl_2H_2$) with ammonia ($NH_3$). It is also preferred that layer (130) has a thickness between about 1200 to 2500 Å.

Figure 2B:
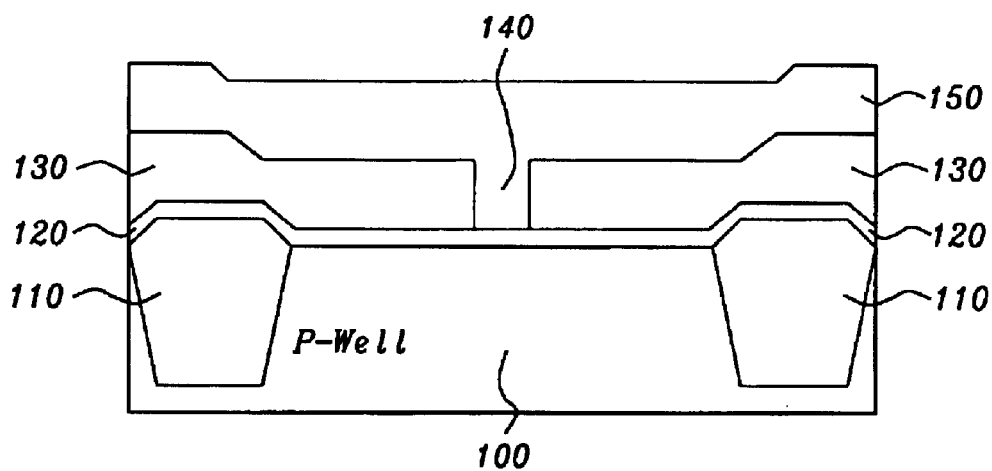
FIG. 2b is a cross-sectional view of a semiconductor substrate showing the forming of a disposable dielectric spacer over the substrate of FIG. 2b, according to the present invention.

Next, dielectric layer (150) is formed over the substrate, including opening (140), as shown in FIG. 2b to form disposable spacers at the following step. Forming dielectric layers are known in the art. Blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, the blanket first dielectric layer (150) is preferably formed of silicon oxide having a thickness between about 1500 to 3000 Å.

Figure 2C:
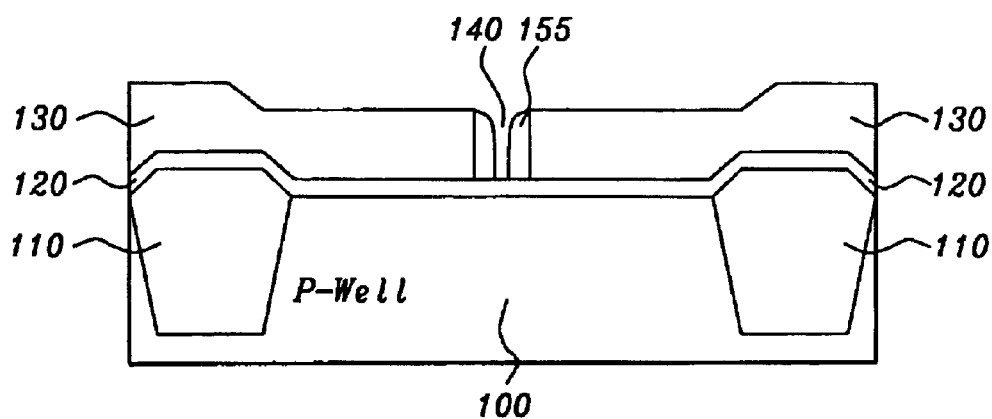
FIG. 2c is a cross-sectional view of a semiconductor substrate showing the forming of disposable dielectric spacers of this invention.
Figure 2D:
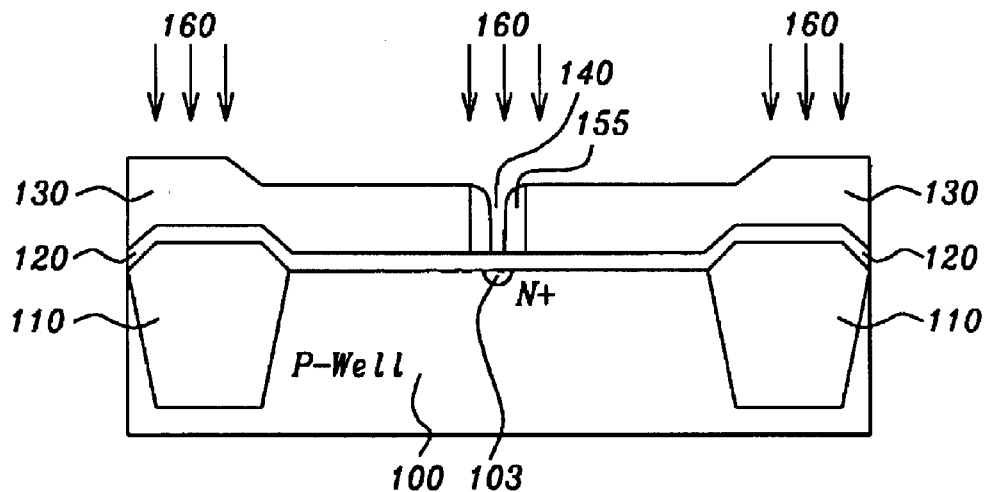
FIG. 2d is a cross-sectional view of a semiconductor substrate showing the floating source implant for the substrate of FIG. 2c of this invention.
Figure 2E:
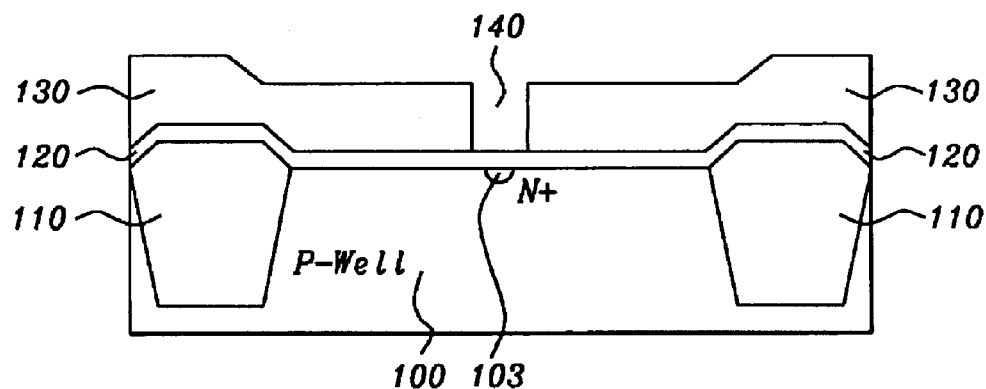
FIG. 2e is a cross-sectional view of a semiconductor substrate showing the removal of the disposable dielectric spacer of FIG. 2d, according to the present invention.

As shown in FIG. 2c, oxide spacers (155) are first formed by patterning and anisotropically etching layer (150), and then are disposed of after performing floating source implant, as shown in FIGS. 2d and 2e. Source implant (160) is accomplished with As ions at a dosage level between about $1\times10^4$ to $1\times10^5$ atoms/cm$^2$ and at an energy between about 5 to 40 KEV. Disposable spacers (155) are removed using either wet or dry etching. Afterwards, tunneling gate oxidation of layer (120) is performed as shown in FIG. 2e.

Figure 2F:
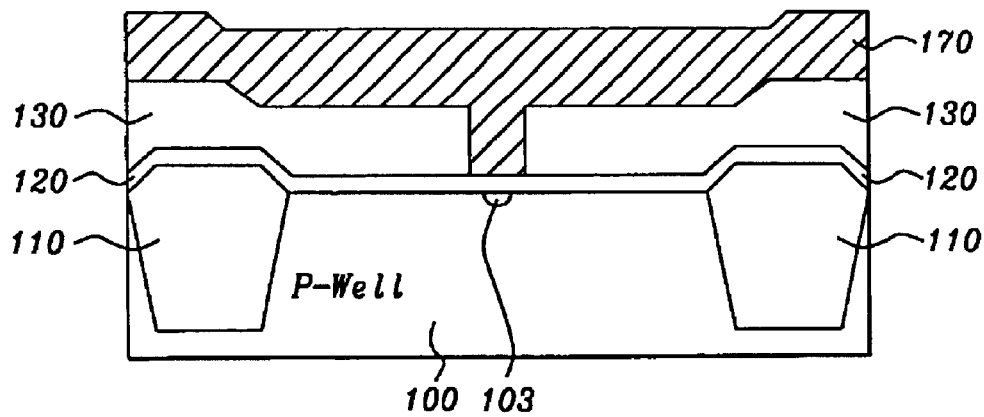
FIG. 2f is a cross-sectional view of a semiconductor substrate showing the forming of first polysilicon layer of the present invention.
Figure 2G:
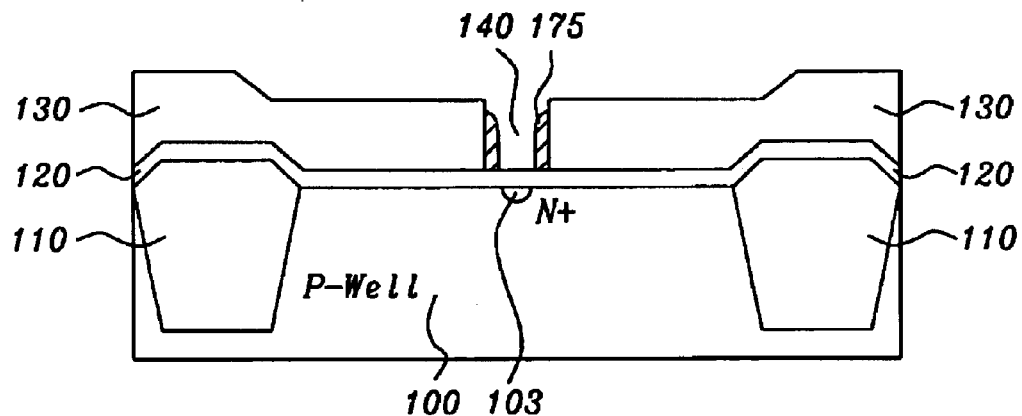
FIG. 2g is a cross-sectional view of a semiconductor substrate showing the forming of the floating gate spacers of this invention.
Figure 2H:
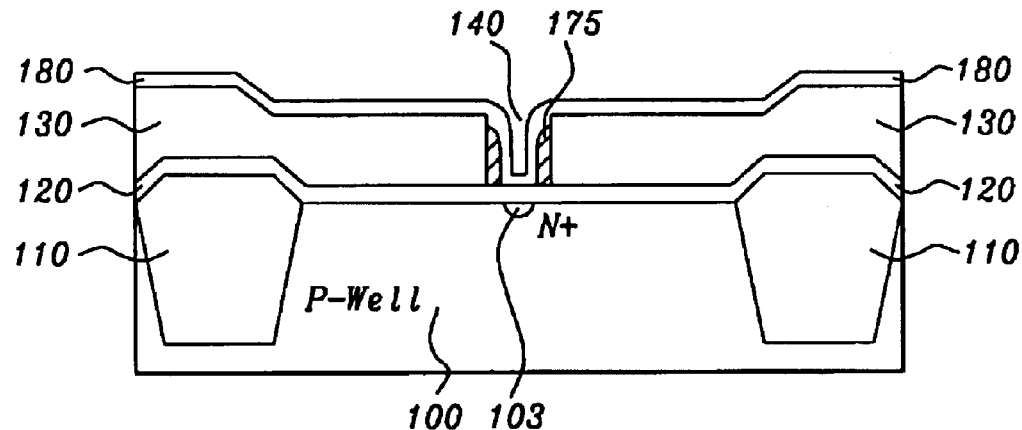
FIG. 2h is a cross-sectional view of a semiconductor substrate showing the forming of the inter-dielectric layer of this invention.

Next, first polysilicon layer (170) is formed over the substrate with silicon source $SiH_4$ using LPCVD at a temperature between about 300 to 700° C., as shown in FIG. 2f. It is preferred that the thickness of layer (170) is between about 1500 to 3000 Å. This is followed, as a main feature and key aspect of the present invention, by the forming of floating gate spacers (175) in opening (140) shown in FIG. 2g. This is accomplished by performing an anisotropic etch of the first polysilicon layer. It will be noted that the resulting polysilicon floating gate spacers are formed on the vertical walls of opening (140). Furthermore, the floating gate spacers have convex surfaces that face each other inwardly. As another important aspect of the instant invention, along with the substrate surface as a whole, the convex walls of the polysilicon spacers are next lined with a conformal dielectric layer (180) as shown in FIG. 2h. It is preferred that this dielectric layer comprises oxide-nitride-oxide (ONO) having a thickness between about 150 to 250 Å, and that it is formed by thermally annealing an oxide layer with dilute $NH_3$ using $N_2$ or Ar as a carrier gas at an elevated temperature between about 600 to 1100° C.

Figure 2I:
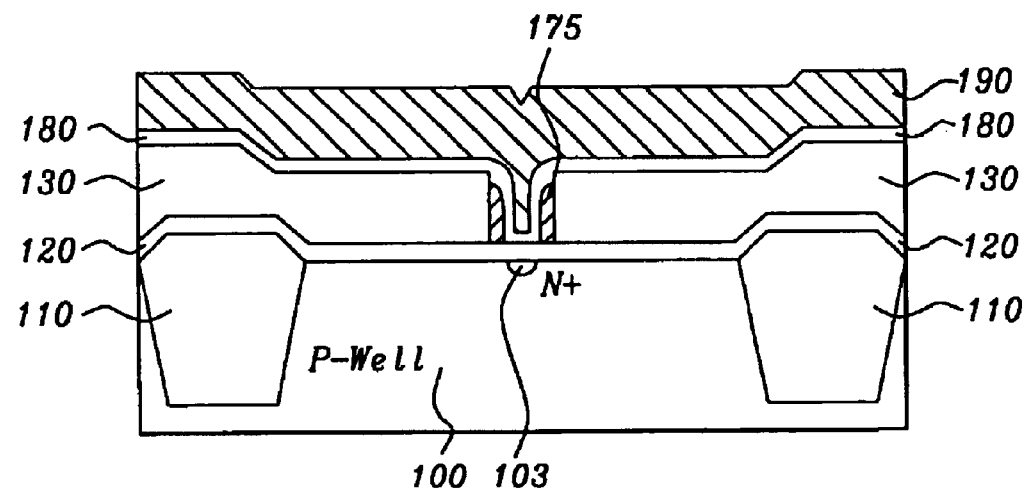
FIG. 2i is a cross-sectional view of a semiconductor substrate showing the forming of the second polysilicon layer of this invention.
Figure 2J:
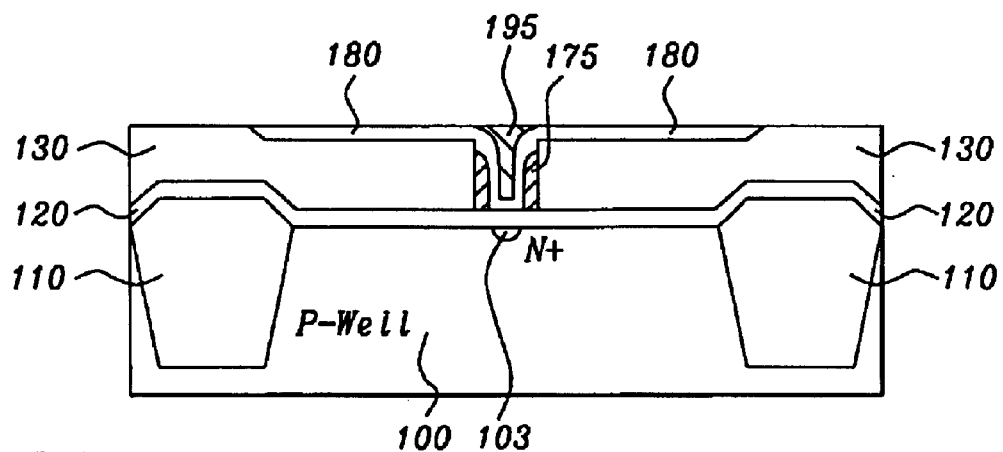
FIG. 2j is a cross-sectional view of a semiconductor substrate showing the chemical-mechanical polishing of the substrate of this invention.
Figure 2K:
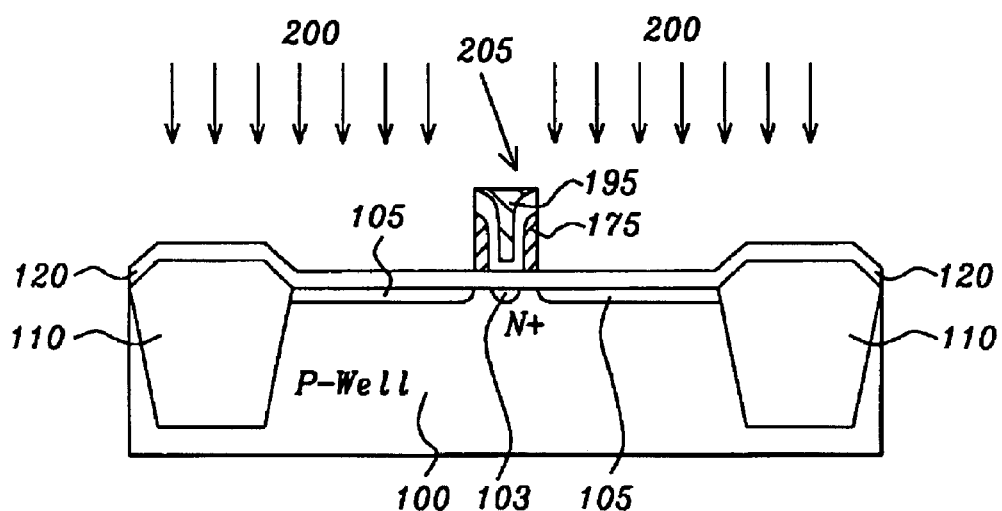
FIG. 2k is a cross-sectional view of a semiconductor substrate showing the forming of the drains of the stand-alone structure of the stacked gate cell of this invention.
Figure 2L:
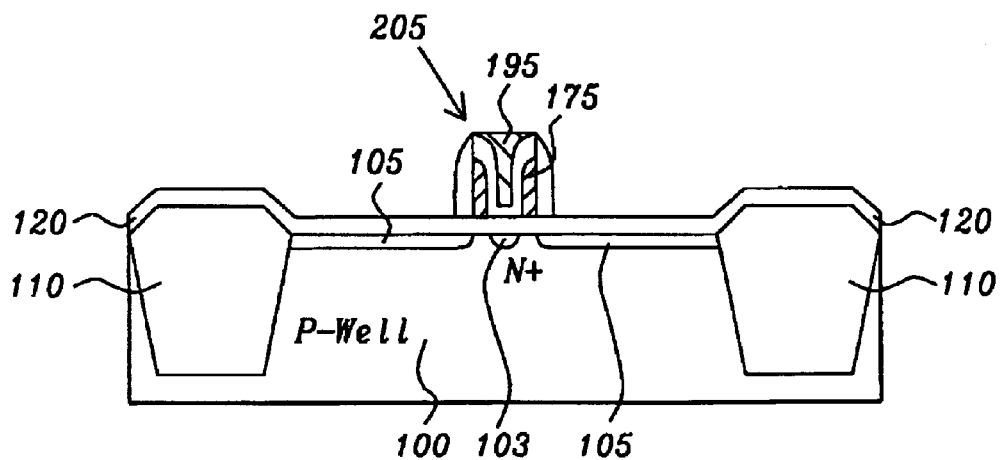
FIG. 2l is a cross-sectional view of a semiconductor substrate showing the forming of the dielectric spacers on the outside walls of the multi-level stacked gate flash memory cell of the present invention.

Still another important aspect of the instant invention is to fill opening (140) with second polysilicon layer (190) as shown in FIG. 2i, and subsequently planarize it by chemical-mechanical polishing (CMP) as shown in FIG. 2j. CMP stops at the conformal ONO layer (180). Second polysilicon layer is formed with silicon source $SiH_4$ using LPCVD at a temperature between about 300 to 700° C. It will be appreciated by those skilled in the art that control gate (195) and multi floating gates (175) along with the intervening dielectric layer (180) form the structure of the presently disclosed stacked gate flash memory cell with two floating gates.

The stand-alone stacked gate structure (205) itself is formed by removing the upper portions of the dielectric layer (180) adjacent to opening (140)— which is now filled with second polysilicon (195)— and the underlying nitride layer (130). The removal of nitride layer can be accomplished in a high-density-plasma (HDP)etcher. The substrate is then subjected to a medium doped drain (MDD) implant to form drains (105) of cell (205). Finally, spacers (210) are formed by first depositing an oxide layer and then anisotropically etching.

Figure 3A:
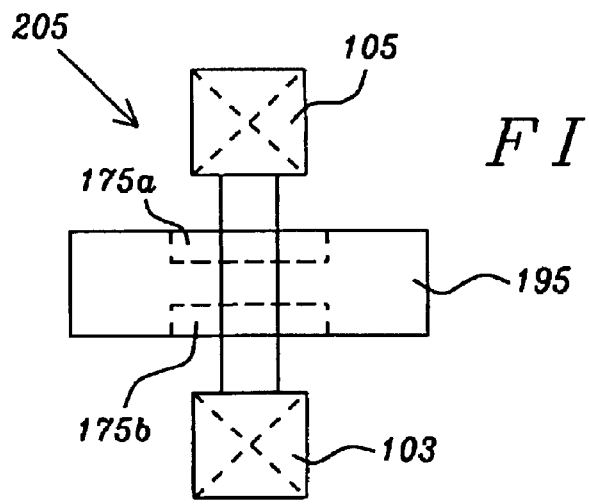
FIG. 3a shows a top view of the cell structure of FIG. 2l of this invention.
Figure 3B:
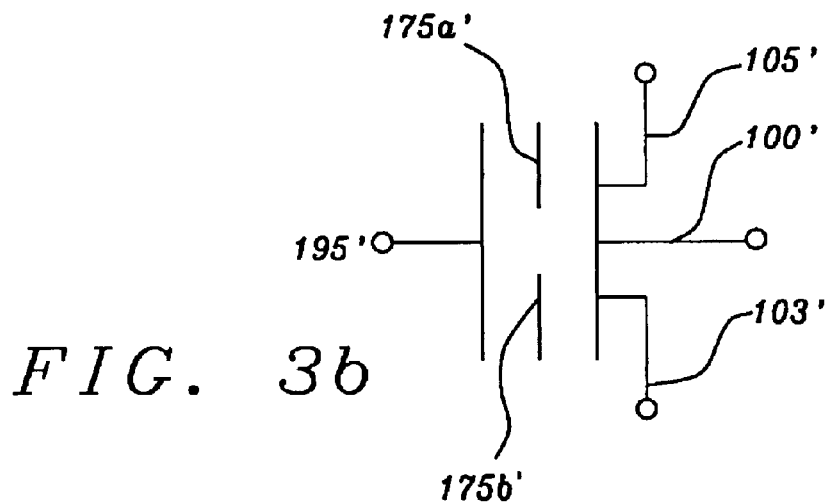
FIG. 3b is an electrical schematic of the multi-level stacked gate flash memory cell of the present invention.
Figure 3C:
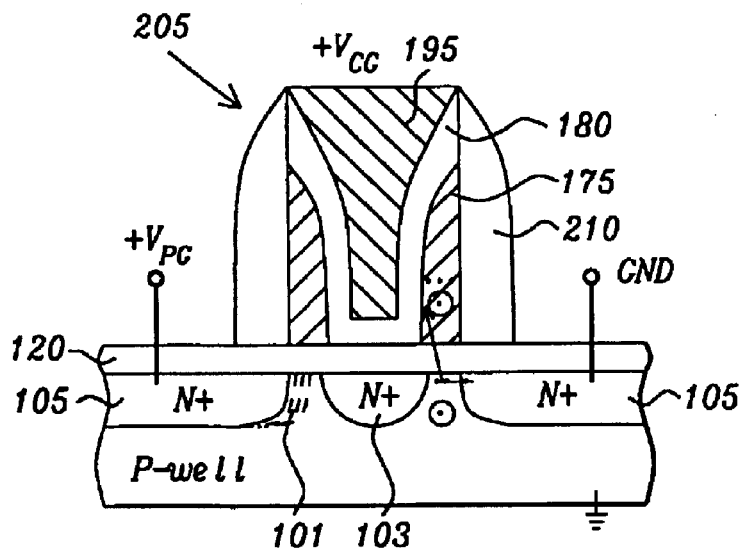
FIG. 3c is a partial cross-sectional view of a semiconductor substrate showing the Program mode of the multi-level stacked gate flash memory cell of the present invention.

FIG. 3a shows a plan view of the stacked gate memory cell (205) where source and drain are referenced with numerals (103) and (105), respectively. The two floating gates are (175a) and (175b), while the control gate is (195) as shown. An electrical representation of the cell is shown in FIG. 3b, where the primed reference numerals correspond to the unprimed numerals in FIG. 3a, noting that the numeral (100) references the substrate.

The Program, Erase and Read operations of the disclosed cell are shown in the table below:

|  |  | CONTROL GATE. $_{CG}$ | DRAIN | SOURCE | P-WELL | A0 | A1 |  |
|---|---|---|---|---|---|---|---|---|
| PROG. $_{PG}$ |  | +$V_{CG.PG}$ | +$V_{PG}$ | GND | GND | 0 | 1 |  |
|  |  | +$V_{CG.PG}$ | GND | +$V_{PG}$ | GND | 1 | 0 |  |
| ERASE. $_{ER}$ |  | -$V_{CG.ER}$ | +$V_{ER}$ | +$V_{ER}$ | +$V_{ER}$ | 0 | 0 | $I_{READ}$ |
| READ. $_{RD}$ | PHASE I | +$V_{CG.RD}$ | +$V_{RD}$ | GND | GND | 0 | 0 | No |
|  |  |  |  |  |  | 0 | 1 | Yes |
|  |  |  |  |  |  | 1 | 0 | No |
|  |  |  |  |  |  | 1 | 1 | Yes |
|  | PHASE II | +$V_{CG.RD}$ | GND | +$V_{RD}$ | GND | 0 | 0 | No |
|  |  |  |  |  |  | 0 | 1 | No |
|  |  |  |  |  |  | 1 | 0 | Yes |
|  |  |  |  |  |  | 1 | 1 | Yes |

In the Program mode, it is preferred that Channel Hot-Electron Injection (CHE) mechanism is used. As is well, known, CHE is one of the four mechanisms employed in order to change the charge content of floating gate devices, the other three being Fowler-Nordheim tunneling (F-N) through thin oxides, enhanced F-N tunneling through polyoxides, and source-side injection (SSI). CHE and F-N mechanisms are based on a quantum mechanical tunneling through an oxide layer, whereas the enhanced F-N and SSI are based on injection of carriers that are heated in a large electric field in the silicon, followed by injection over the energy barrier of $SiO_2$. The CHE mechanism is referenced with numeral (101) in FIG. 3c. In the same figure, voltage levels at the control gate, source and drain are also shown and tabulated in the table above.

Figure 3D:
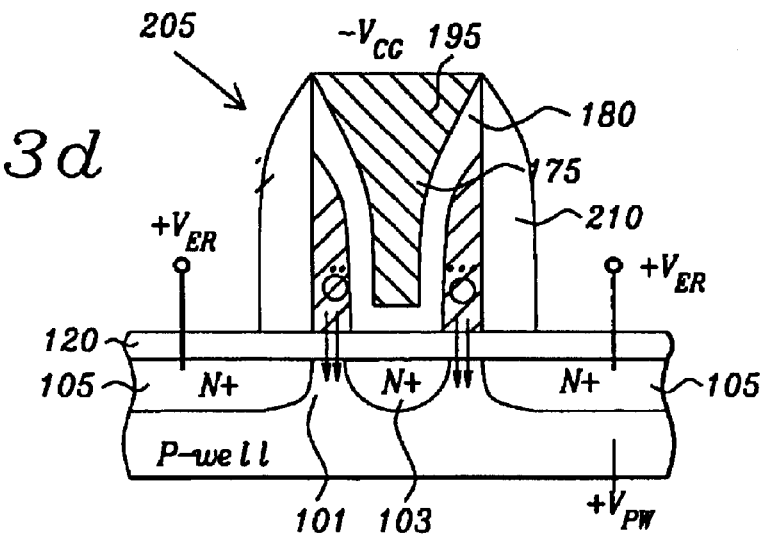
FIG. 3d is a partial cross-sectional view of a semiconductor substrate showing the Erase mode of the multi-level stacked gate flash memory cell of the present invention.
Figure 3E:
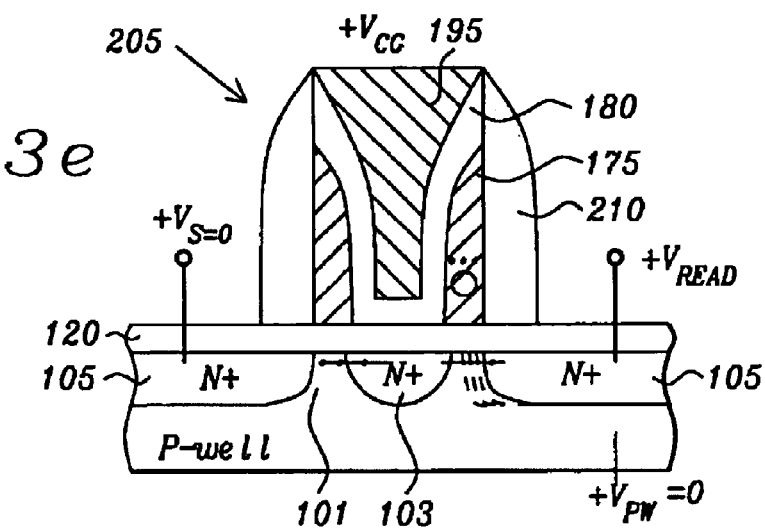
FIG. 3e is a partial cross-sectional view of a semiconductor substrate showing the Read Current mode of the multi-level stacked gate flash memory cell of the present invention.
Figure 3F:
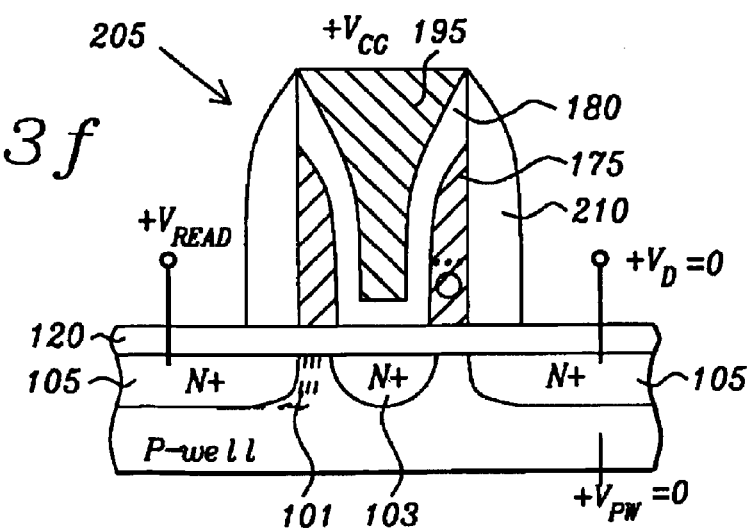
FIG. 3f is a partial cross-sectional view of a semiconductor substrate showing the No Read Current mode of the multi-level stacked gate flash memory cell of the present invention.

In the Erase mode shown in FIG. 3d, control gate is biased negatively while the source and drain positively, as is also indicated in the table above. In the Read mode shown in FIGS. 3e and 3f, the two floating gates of the instant invention are capable of storing 2-bits while attaining 4 states as tabulated in the table above.

It has been disclosed in the present invention a stacked-gate flash memory cell having two floating gates with capability of storing 2-bits while attaining 4-states. The novel two floating gates of this invention are shown schematically in FIG. 3b, which is to be compared with the conventional cell of FIG. 1b. Though numerous details of the disclosed method are set forth here, such as the number of floating gates, to provide an understanding of the present invention, it will be obvious, however, to those skilled in the art that any number of floating gates can be similarly formed to attain a higher multi-level stacked gate flash memory cell. It will be evident that the same methods may be employed in other similar process steps, such as in forming multiple gates in a flash memory cell.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a multi-level, multi-bit stacked gate flash memory cell comprising the steps of:
    providing a substrate having a first dielectric layer formed thereon;
    forming a second dielectric layer over said first dielectric layer;
    forming an opening in said second dielectric layer;
    forming floating-gate spacers inside said opening;
    forming a third dielectric layer over said floating-gate spacers;
    forming a control gate over said third dielectric layer;
    removing said second dielectric layer adjacent said opening, thus leaving a stand-alone cell structure comprising said floating gate spacers and said control gate separated by intervening said third dielectric layer; and
    forming insulative spacers on the outside walls of said cell structure in completion of said multi-level stacked gate flash memory cell.

2. The method of claim 1, wherein said second dielectric layer comprises nitride formed by CVD at a temperature between about 300 to 700° C. by reacting dichlorosilane (SiCl 2H2) with ammonia (NH3).

3. The method of claim 1, wherein said second dielectric layer has a thickness between about 1200 to 2500 Å.

4. The method of claim 1, wherein said forming said floating-gate spacers comprise polysilicon formed by using LPCVD at a temperature between about 300 to 700° C. and then anisotropic etching of said first polysilicon to form spacers.

5. The method of claim 1, wherein said third dielectric layer is (oxide-nitride-oxide) ONO having a thickness between about 600 to 1100° C.

6. The method of claim 1, wherein said forming said control gate comprises polysilicon layer formed with silicon source SiH4 using LPCVD at a temperature between about 300 to 700 ° C.

7. A method of forming a multi-level, multi-bit stacked gate flash memory cell comprising the steps of:
    providing a substrate having gate oxide formed thereon and shallow trench and P-well formed therein;
    forming nitride layer over said substrate;
    patterning a self-aligned gate to form an opening in said nitride layer;
    forming a first oxide layer over said substrate including said opening;
    forming first oxide spacers in said opening;
    performing floating source implant in said substrate through said opening;
    removing said first oxide spacers in said opening;
    forming a first polysilicon layer over said substrate including said opening in said nitride layer;
    forming first polysilicon floating-gate spacers on the vertical walls of said opening in said nitride layer;
    forming a conformal dielectric layer over said substrate including said first polysilicon floating-gate spacers and the bottom of said opening;
    forming second polysilicon layer over said substrate including said opening;
    removing said second polysilicon layer until said conformal dielectric layer over said opening is reached, thus leaving said second polysilicon in said opening as a control gate therebetween said floating-gate spacers with intervening said conformal dielectric layer;
    removing said conformal dielectric layer adjacent said opening and said nitride layer underlying said dielectric layer;
    performing mildly doped drain implant to form the drain of said stacked gate cell;
    forming a second dielectric layer over said substrate including said opening; and
    forming second dielectric spacers on the outside vertical walls of said floating gate spacers to complete the forming of said multi-level stacked gate flash memory cell.

8. The method of claim 7, wherein said forming said nitride layer is accomplished by CVD at a temperature between about 300 to 700° C. by reacting dichlorosilane (SiCl2H2) with ammonia (NH3).

9. The method of claim 7, wherein said nitride layer has a thickness between about 1200 to 2500 Å.

10. The method of claim 7, wherein said floating source implant is accomplished with As ions at a dosage level between about 1×1014 to 1×1015 atoms/cm2 and at an energy between about 5 to 40 KEV.

11. The method of claim 7, wherein said forming said first polysilicon layer is accomplished with silicon source SiH4 using LPCVD at a temperature between about 300 to 700° C.

12. The method of claim 7, wherein said forming said conformal dielectric layer is accomplished by depositing ONO at a temperature between about 600 to 1100° C.

13. The method of claim 7, wherein said conformal dielectric layer has a thickness between about 150 to 250 Å.

14. The method of claim 7, wherein said forming said second polysilicon layer is accomplished with silicon source SiH4 using LPCVD at a temperature between about 300 to 700° C.

15. The method of claim 7, wherein said second polysilicon layer has a thickness between about 1500 to 3000 Å.

16. The method of claim 7, wherein said removing said second polysilicon layer is accomplished by chemical-mechanical polishing (CMP).

17. The method of claim 7, wherein said performing said medium doped drain implant is accomplished with As ions at a dosage level between about $1 \times 10^{14}$ to $1 \times 10^{15}$ atoms/cm2 and at an energy between about 10 to 60 KEV.

18. The method of claim 7, wherein said second dielectric layer has a thickness between about 1500 to 3000 Å.

* * * * *

UNITED STATES PATENT AND TRADEMARK OFFICE
CERTIFICATE OF CORRECTION

PATENT NO. : 6,734,055 B1
DATED : May 11, 2004
INVENTOR(S) : Chrong Jung Lin, Shui-Hung Chen and Hsin-Ming Chen It is certified that error appears in the above-identified patent and that said Letters Patent is hereby corrected as shown below:

Title page,
Item [75], Inventors, delete "Chrong Jung Lin, Hsin-Tian (TW)" and replace with
-- Chrong Jung Lin, Hsin-Tien (TW) --.

Signed and Sealed this

Thirtieth Day of November, 2004

JON W. DUDAS
*Director of the United States Patent and Trademark Office*